United States Patent [19]

Sakurada et al.

[11] Patent Number: 4,682,198

[45] Date of Patent: Jul. 21, 1987

[54] GATE TURN-OFF THYRISTOR WITH INTEGRAL CAPACITIVE ANODE

[75] Inventors: Shuroku Sakurada, Katsuta; Yasuhiko Ikeda, Hitachi, both of Japan

[73] Assignee: Hitachi, Ltd., Tokyo, Japan

[21] Appl. No.: 709,139

[22] Filed: Mar. 7, 1985

[30] Foreign Application Priority Data

Mar. 7, 1984 [JP] Japan .................................. 59-42124

[51] Int. Cl.$^4$ ........................................... H01L 29/74
[52] U.S. Cl. ....................................... 357/38; 357/51; 357/55; 357/58
[58] Field of Search .................. 357/20, 38, 89, 51, 357/90, 55, 58

[56] References Cited

U.S. PATENT DOCUMENTS

| | | | |
|---|---|---|---|
| 3,855,611 | 12/1974 | Neilson et al. | 357/38 |
| 4,146,906 | 3/1979 | Miyata et al. | 357/38 |
| 4,219,832 | 8/1980 | Naito et al. | 357/38 |
| 4,292,646 | 9/1981 | Assour et al. | 357/38 |
| 4,517,582 | 5/1985 | Sittig | 357/38 |

Primary Examiner—Joseph E. Clawson, Jr.
Attorney, Agent, or Firm—Antonelli, Terry & Wands

[57] ABSTRACT

A gate turn-off thyristor is provided having a semiconductor substrate, an anode electrode, a cathode electrode and a gate electrode. The semiconductor substrate includes a P emitter layer connected to the anode electrode, an N base layer adjacent to the P emitter layer, a P base layer adjacent to the N base layer and connected to a gate electrode, and an N emitter layer adjacent to the P base layer and connected to the cathode electrode. In order to improve in its current cut-off performance, the semiconductor substrate further includes a P-type layer provided between the P emitter layer and the N base layer and having the impurity concentration lower than that of the N base layer.

4 Claims, 8 Drawing Figures

GATE TURN-OFF THYRISTOR WITH INTEGRAL CAPACITIVE ANODE

BACKGROUND OF THE INVENTION

The present invention relates to a gate turn-off thyristor, and more particularly, to a gate turn-off thyristor which is improved in its current cut-off performance by minimizing the current amplification factor of one of the transistor elements in the thyristor structure.

The gate turn-off thyristor (referred to as simply a 'GTO' thyristor, hereinafter) is a thyristor which is capable of cutting off current by a gate control in which current is drawn out from the gate and is therefore put into practical use in, for example, an inverter device for controlling the speed of a motor.

The turn-off gain $G_{off}$ (i.e. the ratio between the on-state current flowing when the thyristor is conductive and the gate turn-off current required for cutting off the current) of the thyristor is, as is well known, given by the following formula:

$$G_{off} = \frac{\alpha_{32}}{\alpha_{12} + \alpha_{32} - 1}$$

In the above formula, $\alpha_{32}$ represents the current amplification factor of one of the transistor elements in the thyristor structure which has a gate control terminal connected to its base, while $\alpha_{12}$ represents the current amplification factor of the other transistor element of the thyristor structure.

In this specification, a P base type thyristor, which is more general, will be described hereinafter, and the current amplification factors $\alpha_{32}$ and $\alpha_{12}$ will be respectively referred to as "$\alpha$(n-p-n): and "$\alpha$(p-n-p)".

It is necessary to improve the current cut-off performance of thyristors. More specifically, in order to increase the turn-off gain $G_{off}$ of the GTO thyristor, as will be understood from the above-described formula, it is necessary to increase the current amplification factor $\alpha_{32}$, that is, the current amplification factor $\alpha$(n-p-n) and minimize the current amplification factor $\alpha_{12}$, that is, the current amplification factor $\alpha$(p-n-p).

There are two conventional methods of minimizing the current amplification factor $\alpha$(p-n-p) as described in Hitachi Review, Vol. 29 (1980), No. 3, pp. 127–130, entitled "Gate Turn-Off Thyristor and Drive Circuits".

The first method features doping with a heavy metal, such as gold. Doping with a heavy metal is done with the intent of reducing the carrier life in the $N_B$ layer and thereby decreasing the coefficient of transportation of carriers to the base and, as a result, the current amplification factor $\alpha$(p-n-p) is minimized.

The second methods of minimizing the current amplification factor $\alpha$(p-n-p) features shunting the P emitter. This structure is equivalent to a structure in which the emitter and base of a p-n-p transistor are shunted to each other through a resistor. It is intended by the equivalent shunt resistor to reduce the effective emitter injection efficiency in the p-n-p transistor, thereby minimizing the current amplification factor $\alpha$(p-n-p).

The heavy-metal doping method advantageously makes it possible to improve the current cut-off performance of a thyristor element without impairing its fundamental functional aspect as a thyristor. On the other hand, the heavy-metal doping method is disadvantageous in that a relatively short carrier lifetime in the $N_B$ layer involves increases in the on-state voltage and the leakage current and in that doping with a heavy metal may cause various problems at high temperature including a lowering in the performance of the thyristor element.

The second method in which the P emitter is shortcircuited advantageously makes it possible to overcome the disadvantage of the first method since it is possible to maintain the carrier lifetime at a high level. The second method, however, involves a disadvantage in that the thyristor loses the function of blocking the reverse voltage since the $P_E$ layer is shunted by the $N^+$-type layers.

In the early days of its application, the GTO thyristor was mainly applied to a voltage-type inverter device. In this device, only a forward voltage is applied to a thyristor element therein, that is, no reverse voltage is applied to the thyristor element. Therefore, early GTO thyristors did not need the capability of blocking a reverse voltage.

However, as the range of application of the GTO thyristor has been widened, the thyristor has been applied to devices other than the voltage type inverter, such as a current type inverter, converter and chopper. In these devices, a reverse voltage equal in magnitude to a forward voltage is applied to a thyristor element.

For this reason, in the case of a high-performance GTO thyristor with the P emitter short-circuited, it is necessary to insert a diode in series, which fact disadvantageously results in causing an increase in the size of the device and a reduction in the efficiency thereof.

SUMMARY OF THE INVENTION

In order to overcome the above-described disadvantages, there is a demand for a GTO thyristor which has a minimized current amplification factor $\alpha$(p-n-p) and still possesses the function of blocking a reverse voltage without doping with a heavy metal.

A primary object of the present invention is to realize a GTO thyristor of high current cut-off performance by overcoming the respective disadvantages of the above-described conventional methods, that is, by preventing the occurrence of any lowering in various other characteristics, while, at the same time, maintaining the function of blocking the reverse voltage.

To this end, according to the present invention, a gate turn-off thyristor is provided which includes a semiconductor substrate having a first layer which is exposed on one of its main surfaces and is of a first conductivity type, a second layer which is adjacent to the first layer and is of a second conductivity type, a third layer which is adjacent to the second layer and is exposed on the other main surface of the substrate, said third layer being of the first conductivity type, a fourth layer which is adjacent to the third layer and is exposed on the main surface of the substrate, said fourth layer being of the second conductivity type, and a fifth layer which is provided between the first layer and the second layer and which is of the first conductivity type. The fifth layer has an impurity concentration which is selected to be smaller than that in said second layer. Naturally, the structure includes PN junctions formed respectively between adjacent ones of said layers which are different from each other in conductivity type. In addition, a first main electrode is conductively connected to at least the first layer, a second main electrode is conductively connected to the fourth layer, and a gate electrode is connected to the third layer.

By the above, it is possible to reduce the injection efficiency at the junction between the fifth layer and the second layer and reduce the current amplification factor of one transistor element. Therefore, it is possible to obtain a GTO thyristor which has the high current cut-off performance and also has the function of blocking a reverse voltage.

DETAILED DESCRIPTION OF THE EMBODIMENTS

Figure 1A:
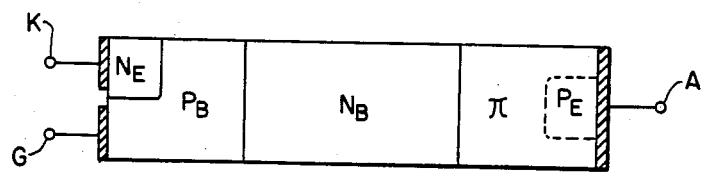
FIG. 1A is a sectional view of one embodiment of a GTO thyristor in accordance with the present invention.

One embodiment of a GTO thyristor in accordance with the present invention is shown in FIG. 1A. As is well known, thyristors generally include a P emitter (a $P_E$ layer) connected to an anode electrode A, and an N base (an $N_B$ layer) adjacent to the P emitter. A P base (a $P_B$ layer) adjacent to the N base (an $N_B$ layer) is also generally connected to a gate electrode G. Further, an N emitter (an $N_E$ layer) adjacent to the P base is typically connected to a cathode electrode K. However, in FIG. 1A, unlike a conventional thyristor, the $P_E$ layer adjacent to the $N_B$ layer is provided with a P-type layer of low impurity concentration (referred to as a "$\pi$ layer", hereinafter) interposed between the $P_E$ layer and the $N_B$ layer.

It should be noted at this point that, although an actual GTO thyristor is, as shown in Japanese Patent Laid-Open No. 131,955/1981, a composite device formed by disposing in parallel in a single semiconductor substrate a multiplicity of PNPN structures, only one PNPN structure is shown in FIG. 1A in order to simplify the explanation.

Figure 1B:
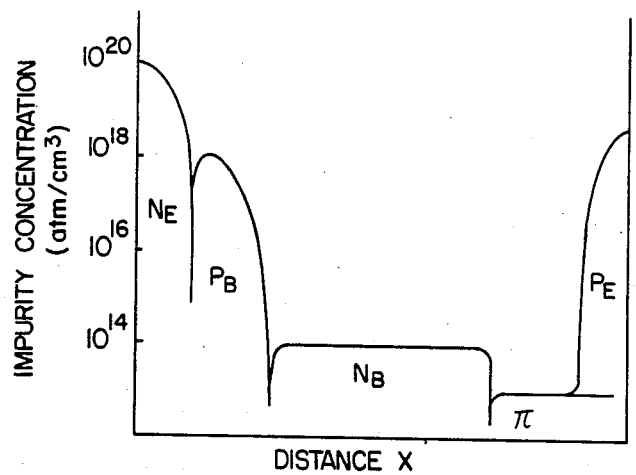
FIG. 1B is a graphical illustration showing an impurity concentration profile in accordance with the present invention.

FIG. 1B shows an impurity concentration profile for the structure of FIG. 1A. In FIG. 1B, the distance x on the abscissa (in the direction of thickness of each of the layers constituting the thyristor) corresponds to the same dimension shown in FIG. 1A. The ordinate represents impurity concentration (i.e., the number of impurity atoms per cm$^3$). As will be clear from the figure, the impurity concentration in the $\pi$ layer is set such as to be lower than that in the $N_B$ layer, that is, about one-tenth of that in the $N_B$ layer. For example, when the impurity concentration in the $N_B$ layer is $5 \times 10^{14}$ atom/cm$^3$, the impurity concentration in the $\pi$ layer is set to $5 \times 10^{13}$ atom/cm$^3$.

As is generally known, the injection efficiency $\gamma$ at a PN junction is represented by the following formula:

$$\gamma = \frac{1}{1 + (\rho(SPE)/\rho(SNB))}$$

In the above formula, $\rho(SPE)$ and $\rho(SNB)$ respectively represent sheet resistances of regions which take part in the diffusion lengths for carriers injected in the $P_E$ layer and the $N_B$ layer and are expressed by the following formula:

$$\rho(S) = \frac{\rho(\text{mean resistivity})}{L(\text{injected carrier diffusion length})}$$

As will be understood from the above formula, when the sheet resistance $\rho(SPE)$ is adequately lower than the sheet resistance $\rho(SNB)$, that is, when the impurity concentration in the $P_E$ layer is adequately higher than that in the $N_B$ layer, the injection effciency $\gamma$ is substantially equal to 1. When the sheet resistances $\rho(SNB)$ and $\rho(SPE)$ are equal to each other, the injection efficiency $\gamma$ is equal to 0.5. Further, when the sheet resistance $\rho(SPE)$ is sufficiently higher than the sheet resistance $\rho(SBN)$, that is, when the impurity concentration in the $P_E$ layer is sufficiently lower than that in the $N_B$ layer, the injection efficiency $\gamma$ is substantially equal to 0.

Accordingly, as will be easily understood, the provisions of the $\pi$ layer of low impurity concentration on the side of the $P_E$ layer on which it is in contact with the $N_B$ layer as in the case of the present invention makes it possible to minimize the injection efficiency at the PN junction concerned.

Figure 1C:
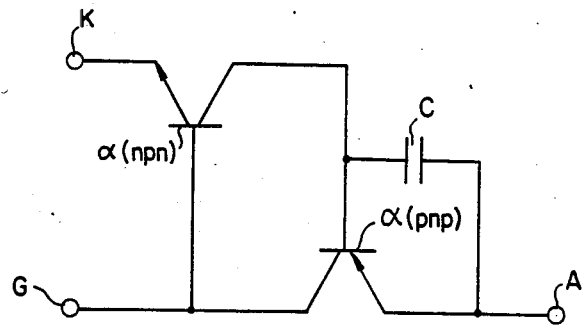
FIG. 1C is a circuit diagram showing an equivalent circuit of one embodiment of the present invention.

The structure of the present invention is regarded as an arrangement in which the emitter and base of a p-n-p transistor are shunted to each other through a capacitance C, as shown by an equivalent circuit of FIG. 1C. When the GTO thyristor is turned ON, the anode current is by-passed through the capacitance C to charge the same, whereby it is possible to lower the current amplification factor $\alpha$(p-n-p) effectively. When the GTO thyristor is turned OFF, the p-n-p transistor can be quickly turned OFF by the discharge current from the capacitance C.

Figure 2A:
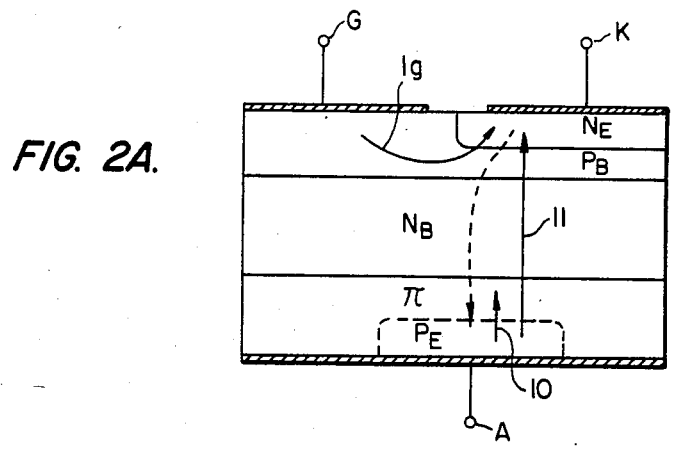
FIG. 2A is a schematic sectional view for describing the turn-on operation of the GTO thyristor in accordance with the present invention.

The above-described operations of the GTO thyristor will be described hereinunder in more detail with reference to FIGS. 2A nd 2B. FIG. 2A is a schematic illustration for describing the turn-on operation of the GTO thyristor in accordance with the present invention.

When the gate turn-on current $I_g$ flows from the $P_B$ layer to the $N_E$ layer, electrons are injected from the $N_E$ layer into the $P_B$ layer. The injected electrons pass, as shown by the dotted-line arrow, through the $N_B$ layer serving as a collector and flow into the $P_E$ layer through the $\pi$ layer.

At the $\pi$-$N_B$ emitter junction, in this case, since the impurity concentration in the $\pi$ layer is lower than that in the $N_B$ layer, it is possible to substantially prevent the injection of holes into the $N_B$ layer from the $\pi$ layer. The holes injected from the $P_E$ layer as shown by the arrow 10 are employed to increase the carrier concentration in the $\pi$ layer.

By the above-described process, the hole concentration in the $\pi$ layer is rapidly increased to exceed the electron concentration in the $N_B$ layer. At this time, the injection of holes into the $N_B$ layer occurs, causing the GTO thyristor to turn ON. As a result, the anode current flows as shown by the arrow 11. During the current conducting period after the thyristor has been turned on, the $\pi$ layer is filled up with the holes injected from the $P_E$ layer and therefore operates as an emitter which excellently injects the holes into the $N_B$ layer.

Figure 2B:
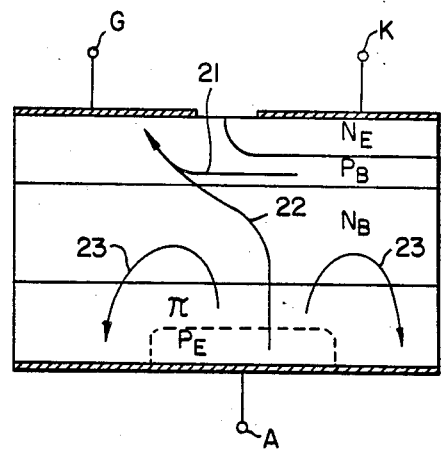
FIG. 2B is a schematic sectional view for describing the turn-off operation of the GTO thyristor in accordance with the present invention.

FIG. 2B is a schematic illustration for describing the turn-off operation of the thyristor in accordance with the present invention. The gate turn-off current 21 sweeps the excess carriers in the $P_B$ layer and draws in the anode current to the gate G as shown by the arrow 22. The holes injected into the $N_B$ layer from the $\pi$ layer return back to the $\pi$ layer as shown by the arrow 23 due to a rapid reduction in the amount of excess carriers in the $\pi$ layer and, therefore, the excess carriers in the $N_B$ layer are rapidly swept out.

The turn-off ability of the thyristor element is improved by the above-described mechanism.

The GTO thyristor in accordance with the present invention has the function of blocking the reverse voltage. This is because the $\pi$-$N_B$ junction formed all over one surface of the $N_B$ layer has an excellent voltage-blocking performance and because the junction is not exposed such as to shunt to the anode electrode.

Figure 3:
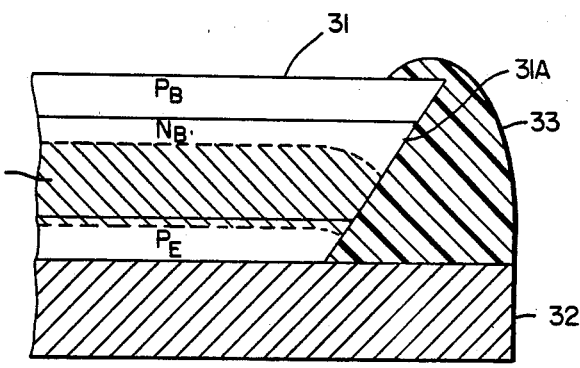
FIG. 3 is a schematic sectional view showing the structure of an end surface of a conventional GTO thyristor.
Figure 4:
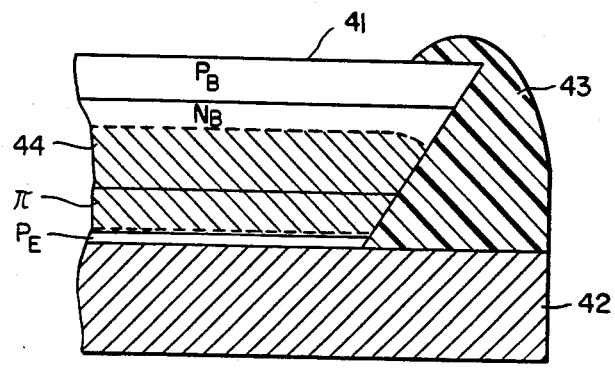
FIG. 4 is a schematic sectional view showing the structure of an end surface of the GTO thryristor in accordance with the present invention.

The reverse-voltage blocking characteristic of the GTO thyristor in accordance with the present invention will be further described hereinunder with reference to FIGS. 3 and 4.

FIGS. 3 and 4 are schematic sectional views respectively showing the structure of an end surface passivation of a conventional GTO thyristor and that of the GTO thyristor in accordance with the present invention.

FIG. 3 shows the end surface structure of a conventional GTO thyristor showing a GTO thyristor element 31, an anode electrode 32 and a protective element 33 (e.g., passivation glass) and having a reverse-voltage blocking characteristic. In order to lessen the electric field at the $P_B$-$N_B$ junction which carries a forward voltage, it is general practice to subject the thyristor to machining known as "bevelling". By this process, the end surface 31A of the GTO thyristor element 31 is machined such that the sectional area of the portion of the thyristor on the side thereof which is closer to the $N_B$ layer of low impurity concentration is smaller than that of the portion of the thyristor on the other side thereof.

As will be clear from the depletion layer 34 (i.e., the shaded portion) in FIG. 3, however, the inclination of the end surface at the $P_E$-$N_B$ junction forms a negative bevelling. For this reason, in a state wherein the thyristor carries a reverse voltage, the field strength is increased instead, thus causing a lowering in the reverse-voltage blocking characteristic of the thyristor.

FIG. 4 shows one example of the end surface structure of the GTO thyristor in accordance with the invention. It shows a GTO thyristor element 41, an anode electrode 42 and a protective layer 43. In this case, when a reverse voltage is applied to the thyristor, since the impurity concentration of the $\pi$ layer is low, the depletion layer 44 (the shaded portion in the figure) is satisfactorily expanded, thus preventing any lowering of the reverse-voltage blocking characteristic.

In other words, in the GTO thyristor in accordance with the present invention, a single bevelling allows both the forward blocking junction and the reverse blocking junction to have positive bevelling and, therefore, it is easy to improve the voltage blocking characteristic. Further, the anode electrode 42 may be provided only on the $P_E$ layer as in the case of this embodiment. From the viewpoint of minimization of the current amplification factor $\alpha$(p-n-p), however, it is preferable that the anode electrode 42 should also be provided on the $\pi$ layer as shown in FIG. 1A.

Moreover, the GTO thyristor in accordance with the present invention is improved in its current cut-off characteristic by the above-described operational function of the $\pi$-$N_B$ junction. Therefore, as will be clear from this fact, there is no need for doping with a heavy metal, such as gold.

Accordingly, there is no possibility of any increase in the on-state voltage or in the leakage current. Neither are the various characteristics adversely affected by high temperature.

Figure 5:
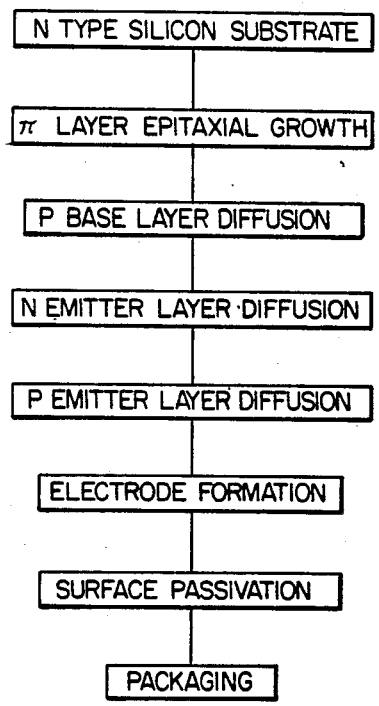
FIG. 5 is a flowchart showing one example of a method of manufacturing the GTO thyristor in accordance with the present invention.

FIG. 5 is a flowchart showing one example of a method of manufacturing the GTO thyristor in accordance with the present invention.

First of all, a $\pi$ layer is epitaxially grown on one of the surfaces of an N-type silicon substrate, thereby forming a $\pi$-$N_B$ junction.

Then, a P base layer, an N emitter layer and a P emitter layer are successively formed by diffusion, thereby completing the whole jucntions.

Thereafter, ordinary steps are carried out for formation of electrodes and other treatments, such as surface passivation, to complete a thyristor element, which is then assembled in a package.

Thus, the GTO thyristor in accordance with the present invention is easily produced by adding to the conventional manufacturing method only the growth of the $\pi$ epitaxial layer carried out in the initial step of the manufacturing process. Accordingly, there is no difficulty in production of the GTO thyristor in accordance with the present invention.

As has been described above, according to the present invention, it is possible to obtain a high-performance GTO thyristor which has the function of blocking a reverse voltage and is not required to be doped with any heavy metal. Further, the manufacture of the thyristor is neither difficult nor complicated. Accordingly, the manufacturing cost is not greatly increased. Furthermore, the GTO thyristor in accordance with the present invention makes it possible to obtain a reverse-voltage blocking characteristic which is superior to that obtained by the conventional thyristor structure.

Although specific values have been given in FIG. 1B for the impurity concentrations of the different layers, it is to be understood that these are for purposes of example only. Thus, other values could be used, as long as the impurity concentration of the $\pi$ layer remained less than that of the $N_B$ layer to bring about the effects discussed above.

It is to be understood that the above-described arrangements are simply illustrative of the application of the principles of this invention. Numerous other arrangements may be readily devised by those skilled in the art which embody the principles of the invention and fall within its spirit and scope.

We claim:
1. A gate turn-off thyristor comprising:
a semiconductor substrate having a first layer which is exposed on a first main surface of said semiconductor substrate and which is of a first conductivity type, a second layer of a second conductivity type, a third layer of the first conductivity type which is in contact with said second layer to form a PN junction with said second layer and which is exposed on a second main surface of said substrate, a fourth layer of the second conductivity type which is in contact with said third layer to form a PN junction with said third layer and which is exposed on the second main surface of said substrate, and a fifth layer of the first conductivity type which is provided between and in contact with said first layer and said second layer to form a PN junction with said second layer, said fifth layer having an impurity concentration which is selected to be smaller than those in said first and second layers, said fifth layer being exposed on the first main surface of said semiconductor substrate;

an anode electrode conductively connected to at least said first layer at the first main surface of said semiconductor substrate, said anode electrode also being connected to said fifth layer;

a cathode electrode conductively connected to said fourth layer at the second main surface of said semiconductor substrate; and a gate electrode connected to said third layer at the second main surface of said semiconductor substrate, wherein said fifth layer functions as a capacitor to be charged during the turn-on operation and to be discharged during the turn-off operation of the gate turn-off thyristor.

2. A gate turn-off thyristor according to claim 1, wherein the first conductivity type is P type.

3. A gate turn-off thyristor according to claim 1, wherein said semiconductor substrate is bevelled such that a sectional area of a portion of said semiconductor substrate on a side of said substrate which is closer to said fifth layer is smaller than that of a portion of said semiconductor substrate on a side of said substrate which is closer to said third layer.

4. A gate turn-off thyristor according to claim 1, wherein said first layer has a higher impurity concentration than said second layer.

* * * * *